US 6,744,077 B2

(12) United States Patent
Trottier et al.

(10) Patent No.: US 6,744,077 B2
(45) Date of Patent: Jun. 1, 2004

(54) SELECTIVE FILTERING OF WAVELENGTH-CONVERTED SEMICONDUCTOR LIGHT EMITTING DEVICES

(75) Inventors: Troy A. Trottier, San Jose, CA (US); Gerd O. Mueller, San Jose, CA (US); Regina B. Mueller-Mach, San Jose, CA (US); Michael R. Krames, Mountain View, CA (US)

(73) Assignee: Lumileds Lighting U.S., LLC, San Jose, CA (US)

( * ) Notice: Subject to any disclaimer, the term of this patent is extended or adjusted under 35 U.S.C. 154(b) by 24 days.

(21) Appl. No.: 10/260,090

(22) Filed: Sep. 27, 2002

(65) Prior Publication Data

US 2004/0061124 A1 Apr. 1, 2004

(51) Int. Cl.$^7$ ............................................. H01L 33/00
(52) U.S. Cl. .......................... 257/103; 257/89; 257/98; 257/99; 257/100
(58) Field of Search .......................... 257/98, 99, 100, 257/89

(56) References Cited

U.S. PATENT DOCUMENTS

| 5,952,681 A | 9/1999 | Chen ........................... 257/89 |
| 6,340,824 B1 * | 1/2002 | Komoto et al. ............... 257/99 |

\* cited by examiner

Primary Examiner—David Nelms
Assistant Examiner—Mai-Huong Tran
(74) Attorney, Agent, or Firm—Patent Law Group LLP; Rachel V. Leiterman

(57) ABSTRACT

A light emitting device includes a semiconductor light emitting device chip having a top surface and a side surface, a wavelength-converting material overlying at least a portion of the top surface and the side surface of the chip, and a filter material overlying the wavelength-converting material. The chip is capable of emitting light of a first wavelength, the wavelength-converting material is capable of absorbing light of the first wavelength and emitting light of a second wavelength, and the filter material is capable of absorbing light of the first wavelength. In other embodiments, a light emitting device includes a filter material capable of reflecting light of a first wavelength and transmitting light of a second wavelength.

18 Claims, 4 Drawing Sheets

US 6,744,077 B2

SELECTIVE FILTERING OF WAVELENGTH-CONVERTED SEMICONDUCTOR LIGHT EMITTING DEVICES

BACKGROUND

1. Field of Invention

This invention relates to semiconductor light emitting devices including a wavelength-converting material and a filter material.

2. Description of Related Art

The color of light emitted from a semiconductor light emitting device chip such as a light emitting diode may be altered by placing a wavelength-converting material in the path of the light exiting the chip. The wavelength-converting material may be, for example, a phosphor. Phosphors are luminescent materials that can absorb an excitation energy (usually radiation energy) and store this energy for a period of time. The stored energy is then emitted as radiation of a different energy than the initial excitation energy. For example, "down-conversion" refers to a situation where the emitted radiation has less quantum energy than the initial excitation radiation. The energy wavelength effectively increases, shifting the color of the light towards red.

If some light emitted from the chip is not absorbed by the phosphor, the unconverted light emitted from the chip mixes with the light emitted from the phosphor, producing a color between the color of the light emitted from the chip and the color of the light emitted from the phosphor. When used in applications requiring a particular color, the color of light emitted from the chip and the amount of light converted by the phosphor must be tightly controlled.

SUMMARY

In accordance with embodiments of the invention, a light emitting device includes a semiconductor light emitting device chip having a top surface and a side surface, a wavelength-converting material overlying at least a portion of the top surface and the side surface of the chip, and a filter material overlying the wavelength-converting material. The chip is capable of emitting light of a first wavelength, the wavelength-converting material is capable of absorbing light of the first wavelength and emitting light of a second wavelength, and the filter material is capable of absorbing light of the first wavelength. In other embodiments, a light emitting device includes a filter material capable of reflecting light of a first wavelength and transmitting light of a second wavelength.

The filter material prevents at least a portion of light emitted from the chip that is unconverted by the wavelength-converting material from escaping the device. Use of the filter material may increase the color purity and lumen output of a wavelength converted semiconductor light emitting device.

DETAILED DESCRIPTION

In accordance with embodiments of the invention, a light emitting device includes a wavelength-converting layer for converting the wavelength of light emitted from a light emitting device chip, and a filter layer for filtering out any unconverted light from the chip. The example of a III-nitride flip chip is considered below. It is to be understood that the invention is not limited to the materials, device orientations, or other details discussed in the examples below. For example, the embodiments of the invention may be applied to any suitable light emitting device materials system, including for example III–V materials, III-nitride materials, III-phosphide materials, and II–VI materials. Embodiments of the invention may be applied to any device geometry, including devices with contacts on opposite sides of the semiconductor layers and devices with contacts on the same side of the semiconductor layers, such as flip chips where light is extracted through a substrate, and epitaxy-up structures where light is extracted through the contacts.

Figure 1:
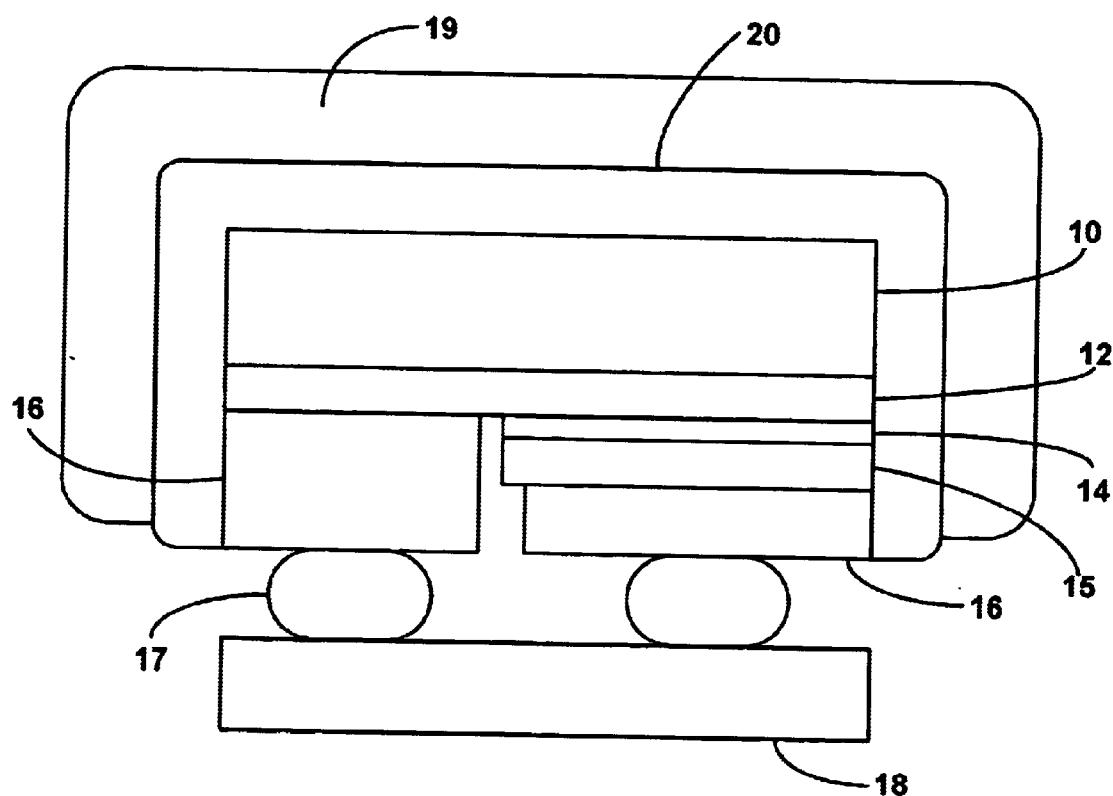
FIG. 1 illustrates an embodiment of the present invention.

FIG. 1 illustrates an embodiment of the present invention. A light emitting device chip includes a substrate 10, an n-type region 12, an active region 14, and a p-type region 15. In one embodiment, n-type region 12, active region 14, and p-type region 15 are III-nitride materials, having the formula $Al_xIn_yGa_zN$, where $0 \leq x \leq 1$, $0 \leq y \leq 1$, $0 \leq z \leq 1$, $x+y+z=1$. Substrates suitable for the growth of III-nitride materials include GaN, SiC, and sapphire. Each of n-type region 12, active region 14, and p-type region 15 may be a single layer or multiple layers with the same or different compositions, thicknesses, and dopant concentrations. A portion of type region 15 and active region 14 is removed to expose a portion of n-type region 12. Contacts 16 are formed on the remaining portion of p-type region 15 and the exposed portion of n-type region 12. Contacts 16 may be electrically and physically connected to a submount 18 by submount interconnects 17. Submount interconnects may be, for example, solder. Contacts 16 may be reflective, such that light generated in active region 14 is extracted from the chip through substrate 10.

A wavelength-converting layer 20 is formed over the chip. The wavelength-converting material may be, for example, yttrium aluminum garnet doped with praseodymium and cerium (YAG:Pr+Ce), strontium sulfide doped with europium (SrS:Eu), strontium thiogallate, or any other suitable phosphor. Wavelength-converting layer 20 may be formed by, for example, electrophoretic deposition, stenciling, screen printing, and any other suitable technique. Wavelength-converting layer 20 need not cover all of the top and sides of the chip, as illustrated in FIG. 1. Multiple wavelength-converting materials capable of converting the wavelength emitted from the chip to the same or different wavelengths may be incorporated into wavelength-converting layer 20, or wavelength-converting layer may be comprised of multiple discrete sublayers, each containing a different wavelength-converting material.

A filter layer 19 is formed over wavelength-converting layer 20. Filter layer 19 absorbs light of the wavelength emitted by active region 14 of the light emitting device chip and transmits light of the wavelength or wavelengths emitted by wavelength-converting layer 20. The materials in filter layer 19 may be selected and deposited such that some or all of the unconverted light emitted by the chip is prevented from escaping the device. The filter material may be, for example, a material that absorbs the unconverted light emitted by the chip and dissipates the energy as heat. Examples of suitable filter materials include inorganic and organic dyes.

Figure 2:
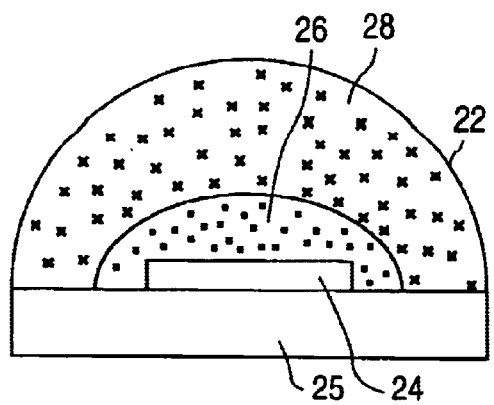
FIG. 2 illustrates an alternate embodiment of the present invention.

FIG. 2 illustrates an alternative embodiment of the present invention. In the embodiment illustrated in FIG. 2, rather than being conformally coated on the light emitting device chip, the filter layer and wavelength-converting layer are dispersed in a material overlying the chip. In the device illustrated in FIG. 2, a pedestal 25 supports light emitting device chip 24 and lens 22, creating a space between chip 24 and lens 22 that may be occupied by a hard or soft encapsulant. Examples of suitable encapsulant materials include hard or soft silicone and epoxy. The encapsulant material is generally selected such that the refractive index of the encapsulant matches the refractive index of materials adjacent to the encapsulant (e.g. the substrate of the chip) as closely as possible. In addition, the encapsulant material may be selected for its ability to mix with the wavelength converting material and/or the filter material. Particles of a wavelength-converting material such as phosphor are dispersed in a first layer of encapsulant 26 close to chip 24. Particles of a filter material are dispersed in a second layer of encapsulant 28 overlying wavelength-converting layer 26. The same or different encapsulating materials may be used for the wavelength-converting material and the filter material. Chip 24, wavelength-converting layer 26, filter layer 28, and lens 22 need not be adjacent to each other as illustrated in FIG. 2. Air, additional layers of encapsulant, or layers of other materials may separate any of the layers illustrated in FIG. 2. In addition, wavelength-converting layer 26 may contain multiple wavelength-converting materials, or may be multiple discrete sublayers containing the same or different wavelength-converting materials. Filter layer 28 may also contain multiple filtering materials and may be multiple discrete sublayers containing the same or different filtering materials.

In other embodiments, filter layer 28 of FIG. 2, which includes a filter material dispersed in an encapsulant, is used in combination with the conformal wavelength-converting layer 20 of FIG. 1. In other embodiments, the filter material may be coated on the inside of lens 22 of FIG. 2, on the outside of lens 22, or incorporated in the material that forms lens 22. In the embodiments described above, the filter material absorbs the unwanted unconverted emission from the chip. In still other embodiments, the filter material may reflect the unwanted unconverted emission from the chip, while transmitting the wanted wavelength-converted emission. For example, the filter material may be a series of layers of dielectric materials with refractive indices selected to transmit the wavelength converted light while reflecting the unconverted light. The dielectric materials may be selected from known coatings for the ability to transmit the converted wavelengths and reflect the unconverted wavelengths, and the ability to withstand both the converted and unconverted wavelengths.

In one example, the unconverted emission from the chip is blue light with a wavelength less than 500 nm and the wavelength-converted emission is green with a wavelength greater than 500 nm.

Figure 3:
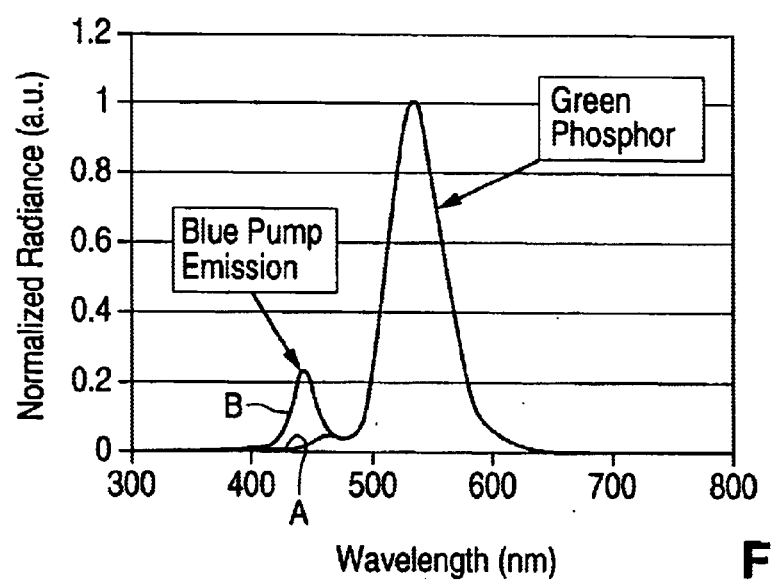
FIG. 3 illustrates the emission spectra of two devices, one with a filter layer and one without a filter layer.

FIG. 3 illustrates the emission spectra of two devices, each with a 450 nm blue-emitting chip covered and a 535 nm green-emitting phosphor layer, one with a filter layer (device A) and one without (device B). The inclusion of a filter layer in device A almost completely prevents light emitted by the device chip from escaping the chip. Thus, light from the device chip does not significantly impact the color of light visible from device A. The light from device A will appear green. In contrast, device B has a small peak of emission from the device chip. The light from device B may appear greenish blue due to the emission from the chip.

Including a filter layer in a wavelength-converted semiconductor light emitting device may offer several advantages. First, the use of a filter layer allows tight control of the color and color purity of light produced by the device. The wavelength of light emitted by a light emitting device chip depends on the composition of the active region, which may be difficult to control during fabrication. In contrast, typically wavelength-converting materials emit the same color of high color purity light regardless of the wavelength of the absorbed light, as long as the wavelength of the absorbed light is in a wavelength range capable of exciting the wavelength-converting material. Accordingly, the use of a wavelength-converting material improves the uniformity of the color of light produced by various devices. The uniformity across devices can be compromised if light from the chip is permitted to mix with the wavelength-converted light. The use of a filter layer prevents light from the chip from escaping the device, thus the only light escaping from the device is the high color purity light emitted by the wavelength-converting material.

Figure 4:
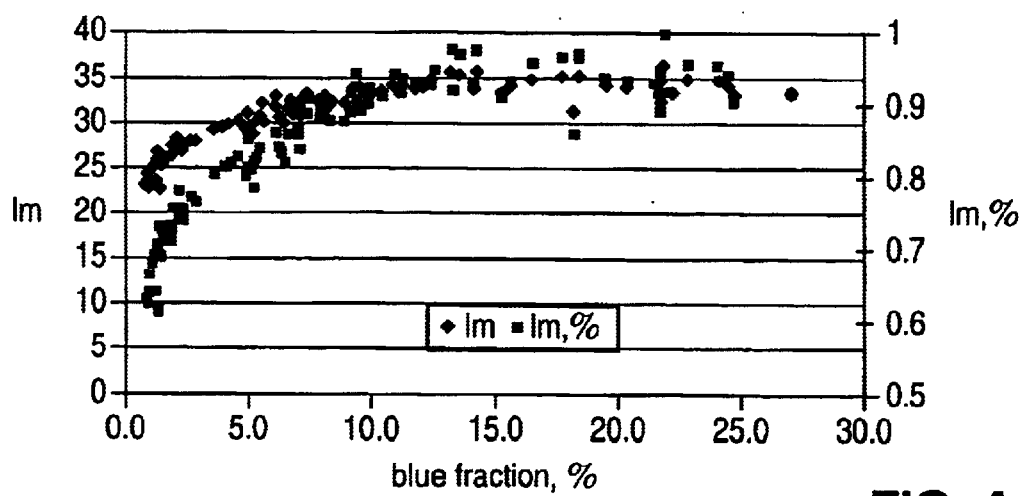
FIG. 4 illustrates the lumen output of several phosphor converted light emitting devices as a function of fraction of light unconverted by the phosphor layer.

Second, the use of a filter layer may increase the lumen output of a wavelength converted semiconductor light emitting device. FIG. 4 illustrates the lumen output of several devices as a function of the fraction of light emitted by the device chip that is unconverted by a phosphor. As illustrated in FIG. 4, devices that allow some light emitted from the chip to leak through the phosphor layer unconverted exhibit a higher lumen output than devices that phosphor-convert all of the light emitted from the chip. In order to completely convert all light emitted by the device chip, a thick phosphor layer must be used. The thick phosphor layer may result in increased back scattering of light, which increases the likelihood that light will be lost through absorption by semiconductor layers in the chip or other portions of the device, reducing the total lumen output of the device. In applications where mixing of the light emitted by the chip and the light emitted by the phosphor is undesirable, the use of a filter permits tuning the thickness and other characteristics of the phosphor layer for maximal phosphor emission, while maintaining the color and color purity of emission from the phosphor by selective absorption of the unconverted light from the chip.

Filters can also be employed to improve the efficiency of LEDs for the generation of white light. This opportunity arises because of the strong dependence of chip extraction efficiency on the loading density or total thickness of wavelength-converting particles surrounding the chip, as described above. As the loading density is increased, the extraction efficiency is reduced. This effect is most easily observed by measuring the light generation efficiency of the device as a function of pump light leakage, which is that fraction of light which is emitted directly from the chip compared to the total amount of generated light (pump light plus converted light). Such measurements have been performed and result in data similar to that shown in FIG. 6.

For an LED chip employing wavelength-conversion media, the total light generated may be written as $$\Phi_{pump} + \Phi_{conv} = \Phi_{in} QE\ QD\ C_{ext}$$

where $\Phi_{pump}$ is the output flux from direct chip emission (i.e., leaking through the converting media), $\Phi_{conv}$ is the wavelength-converted output flux, QE is the quantum efficiency of the wavelength converter, QD is the associated quantum deficit in photon energy, and $C_{ext}$ is the extraction efficiency which depends on pump leakage fraction, which may be written $F_{pump}=\Phi_{pump}/(\Phi_{pump}+\Phi_{conv})$.

The converted light output can now be written in terms of the pump leakage fraction, so that $$\Phi_{conv}=(1-F_{pump})\,\Phi_{in}QE\,QD\,C_{ext}$$

Figure 6:
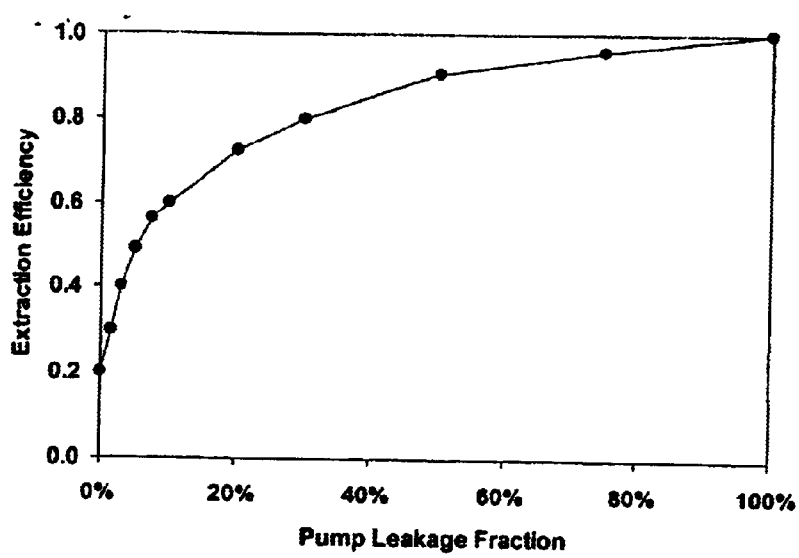
FIG. 6 is a plot of extraction efficiency as a function of pump leakage fraction for a wavelength-converted light emitting device.
Figure 7:
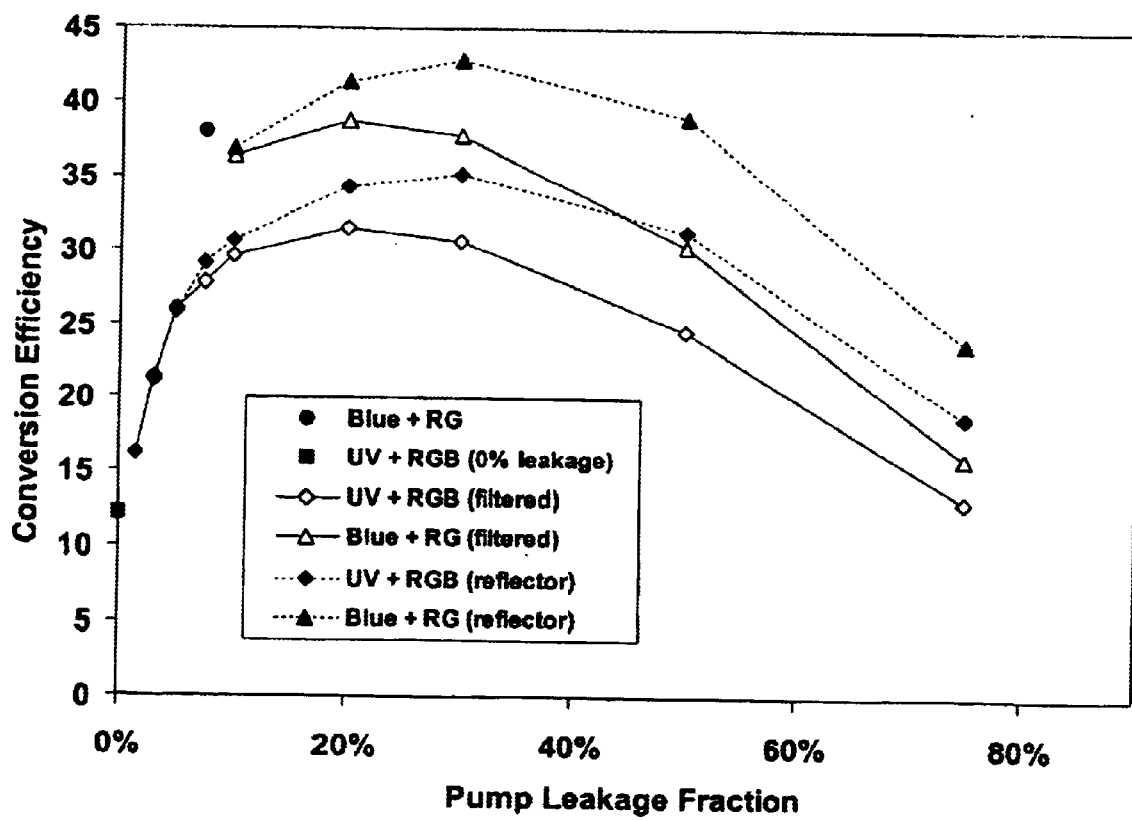
FIG. 7 is a plot of conversion efficiency as a function of pump leakage fraction for blue and UV wavelength-converted devices without filters, with absorbing filters, and with reflectors.

This expression can be used to determine the relative conversion efficiency of chips employing wavelength-converting media as a function of pump leakage fraction, using the experimental dependence given by FIG. 6. Using this approach, we are able to compare the examples of generating white light using either a blue pump LED chip (where the blue emission contributes directly to the white spectrum) or a UV-based pump (wherein the light does not contribute to useable spectrum). The results are shown in FIG. 7, which illustrates calculated conversion efficiencies of LEDs employing wavelength converting media, using either blue or UV pump wavelengths. The conversion efficiency is defined as the total emitted power for the device employing the wavelength converter, divided by the total emitted power of the bare pump LED (no wavelength converting media). The curves labeled "filtered" are data for the case of the device employing an absorbing filter mechanism to reduce or eliminate the leaked pump light as required to maintain the desired output spectrum requirements. The curves labeled "reflector" are data for the case of the device employing a reflective material to reflect leaked pump light back into the device.

These calculations assume wavelength converters of peak wavelengths at 450 nm (blue), 540 nm (green) and 620 nm (red), and with spectral widths typical for phosphors. The blue pump wavelength was taken as 450 nm, while that of the UV pump was taken as 390 nm. For the cases where filters or reflectors are employed, the filter/reflector insertion loss is taken as 10%. The combination of blue, green, and red light was kept at a radiometric ratio of 8%, 37%, and 55% as an estimate to target 2900K white light.

As a reference point, we note the case of a UV-based pump wherein all the light is converted (0% pump leakage, which is presumably necessary for eye safety reasons) gives the poorest conversion efficiency at 12%. A blue-based pump, allowing ~8% leakage which is directly used in the final spectrum, gives a much higher conversion efficiency of ~38% (more than a factor of three improvement).

A dramatic improvement in conversion efficiency can be obtained by allowing more pump leakage, especially for the UV pump case. By employing a filter which later blocks out all the UV light, the device alloying an initial 20% leakage achieves a conversion efficiency of 31.5%, more than a factor of two improvement over the "100% converted" case. A similar, although much weaker, improvement for the blue pump case is obtained by allowing 20% leakage, and employing a filter to correct the final white color point. For this case the conversion efficiency increases from 38% to 39%.

The use of a reflector rather than an absorbing filter material further improves conversion efficiency. In the case of a UV pump device allowing 20% leakage, the use of a reflector rather than an absorbing filter increases the conversion efficiency from 31.5% to 34%. In the case of a blue pump device allowing 20% leakage, the use of a reflector rather than an absorbing filter increases the conversion efficiency from 39% to 42%.

It is clear from this work that allowing more pump light leakage and correcting the final spectra with absorbing or reflecting filters is most important for cases where low pump leakage is required, either in the blue pump case where low white color temperature are required, or in the UV pump case (all cases).

Figure 5:
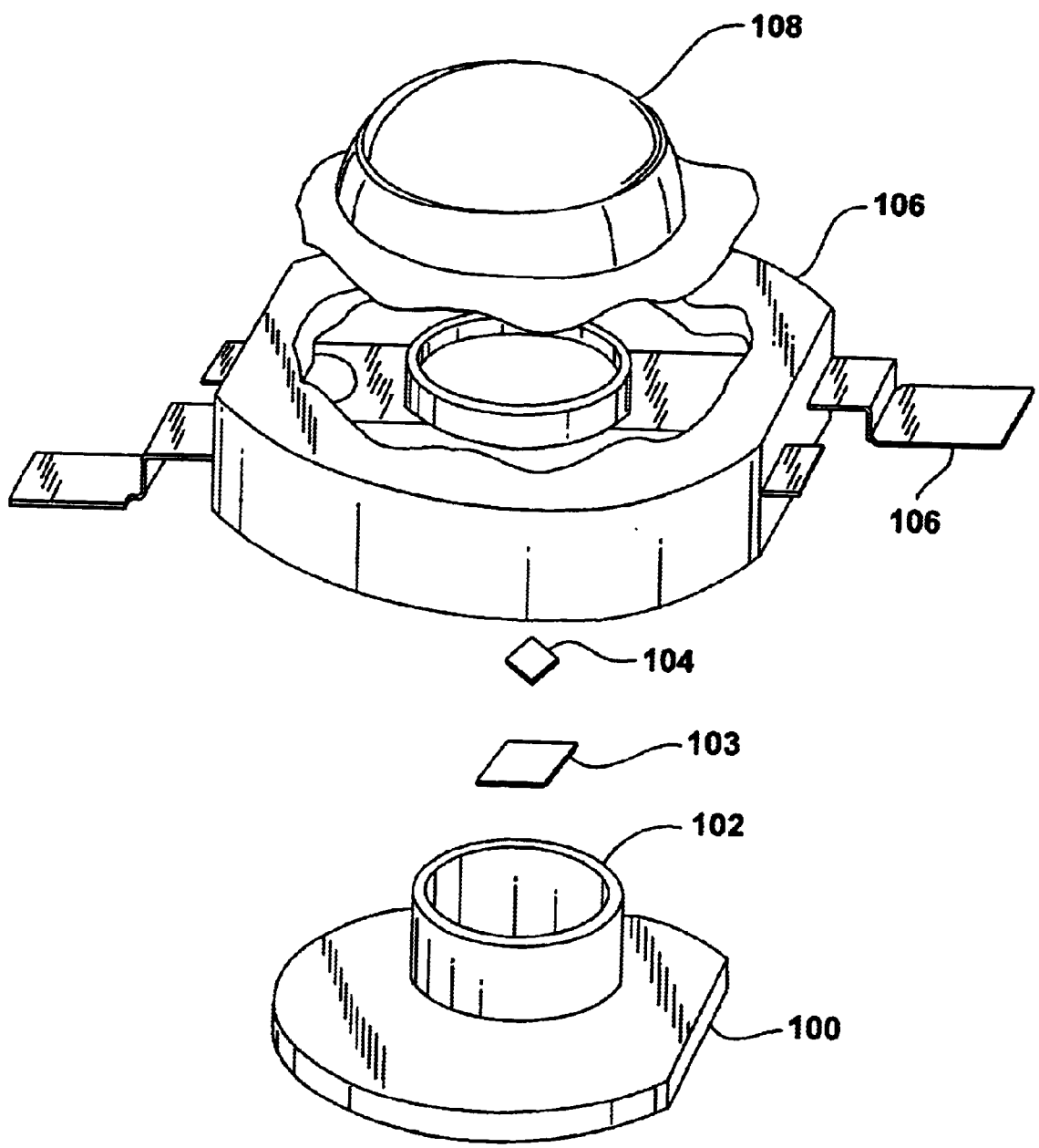
FIG. 5 is an exploded view of a packaged light emitting device.

FIG. 5 is an exploded view of a packaged light emitting device. A heat-sinling slug 100 is placed into an insert-molded leadframe 106. The insert-molded leadframe 106 is, for example, a filled plastic material molded around a metal frame that provides an electrical path. Slug 100 may include an optional reflector cup 102. Alternatively, slug 100 may provide a pedestal without a reflector cup. The light emitting device die 104, which may be any of the devices described above, is mounted directly or indirectly via a thermally conducting submount 103 to slug 100. An optical lens 108 may be added. In embodiments where the wavelength-converting material and/or filter material are dispersed in encapsulants, the encapsulants may be injected between die 104 and lens 108. In embodiments, where a reflector is used to reflect unwanted pump emission back into the device, the reflector may be a series of dielectric layers applied to the inside or the outside surface of lens 108.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is being claimed is:

1. A light emitting device comprising:
   a semiconductor light emitting device chip capable of emitting first light having a first wavelength, the semiconductor light emitting device chip having a top surface and a side surface;
   a wavelength-converting material capable of absorbing the first light and emitting second light having a second wavelength, the wavelength-converting material overlying at least a portion of the top surface and a portion of the side surface; and
   a filter material capable of absorbing the first light, the filter material overlying the wavelength-converting material.

2. The light emitting device of claim 1 wherein the filter material is dispersed in an encapsulant.

3. The light emitting device of claim 2 wherein the encapsulant comprises silicone.

4. The light emitting device of claim 1 further comprising a lens overlying the semiconductor light emitting device chip.

5. The light emitting device of claim 4 further comprising a plurality of leads electrically connected to the semiconductor light emitting device chip.

6. The light emitting device of claim 4 wherein the filter material is coated on a surface of the lens facing the semiconductor light emitting device chip.

7. The light emitting device of claim 4 wherein the filter material is coated on a surface of the lens facing away from the semiconductor light emitting device chip.

8. The light emitting device of claim 4 wherein the filter material is incorporated into the lens.

9. The light emitting device of claim 1 wherein the wavelength-converting material substantially conformally coats the semiconductor light emitting device chip.

10. The light emitting device of claim 1 wherein the wavelength-converting material is a phosphor.

11. The light emitting device of claim 10 wherein the phosphor is selected from the group consisting of YAG, YAG:Ce+Pr, SrS:Eu, and strontium thiogallate.

12. The light emitting device of claim 1 wherein the filter material comprises an organic dye.

13. The light emitting device of claim 1 wherein the filter material does not emit visible light.

14. A light emitting device comprising:

a semiconductor light emitting device chip capable of emitting first light having a first wavelength;

a wavelength-converting material capable of absorbing the first light and emitting second light having a second wavelength, the wavelength-converting material overlying at a top surface of the chip; and a filter material capable of reflecting at least a portion of the first light and transmitting the second light, the filter material overlying the wavelength-converting material.

15. The light emitting device of claim 14 wherein the first light is UV light.

16. The light emitting device of claim 14 wherein the first light is blue light.

17. The light emitting device of claim 14 wherein the filter material comprises at least one dielectric layer.

18. The light emitting device of claim 17 further comprising a lens overlying the semiconductor light emitting device chip, wherein the at least one dielectric layer is formed on a surface of the lens.

* * * * *